(12) United States Patent
Cao et al.

(10) Patent No.: US 11,598,803 B1
(45) Date of Patent: Mar. 7, 2023

(54) SYSTEM AND METHOD FOR COMPENSATING FOR POWER LOSS DUE TO A RADIO FREQUENCY (RF) SIGNAL PROBE MISMATCH IN CONDUCTIVE SIGNAL TESTING

(71) Applicant: LitePoint Corporation, San Jose, CA (US)

(72) Inventors: Chen Cao, Sunnyvale, CA (US); Christian Volf Olgaard, Saratoga, CA (US); Ray Wang, Santa Clara, CA (US)

(73) Assignee: LITEPOINT CORPORATION, San Jose, CA (US)

( * ) Notice: Subject to any disclaimer, the term of this patent is extended or adjusted under 35 U.S.C. 154(b) by 0 days.

(21) Appl. No.: 17/352,553

(22) Filed: Jun. 21, 2021

(51) Int. Cl.
*G01R 31/302* (2006.01)
*H04B 3/48* (2015.01)

(52) U.S. Cl.
CPC ........... *G01R 31/3025* (2013.01); *H04B 3/48* (2013.01)

(58) Field of Classification Search
CPC .............................. G01R 31/3025; H04B 3/48
USPC ...................................................... 324/754.31
See application file for complete search history.

(56) References Cited

U.S. PATENT DOCUMENTS

| | | | |
|---|---|---|---|
| 6,687,289 B1 * | 2/2004 | Bohley | H04B 3/48 375/257 |
| 2005/0174131 A1 * | 8/2005 | Miller | G01R 1/0491 324/754.21 |
| 2006/0224343 A1 | 10/2006 | Visser et al. | |
| 2010/0164519 A1 * | 7/2010 | Sellathamby | G01R 31/318505 324/756.03 |
| 2013/0197850 A1 | 8/2013 | Yu et al. | |
| 2014/0103907 A1 | 4/2014 | Muecke et al. | |
| 2014/0266930 A1 | 9/2014 | Huynh | |
| 2015/0160264 A1 * | 6/2015 | Rada | G01R 31/3025 324/754.21 |

FOREIGN PATENT DOCUMENTS

| | | | | |
|---|---|---|---|---|
| JP | 3847788 B2 * | 11/2006 | ........... | G01S 5/0009 |
| KR | 10-2018-0074799 A | 7/2018 | | |

OTHER PUBLICATIONS

U.S. Appl. No. 17/352,546, filed Jun. 21, 2021, Cao, et al.
International Search Report for International Application No. PCT/US2022/033726, dated Oct. 13, 2022, (4 pages).
Written Opinion for International Application No. PCT/US2022/033726, dated Oct. 13, 2022, (3 pages).

* cited by examiner

*Primary Examiner* — Tung X Nguyen
*Assistant Examiner* — Robert P Alejnikov, Jr.
(74) *Attorney, Agent, or Firm* — Burns & Levinson LLP

(57) ABSTRACT

System and method for compensating for power loss due to a radio frequency (RF) signal probe mismatch in conductive RF signal testing of a RF data signal transceiver device under test (DUT). Sourcing the RF test signal with the RF vector signal transceiver at multiple test frequencies enables isolation of and compensation for power loss due to a mismatch between the RF signal probe and RF DUT connection based on predetermined losses of the RF signal path.

2 Claims, 3 Drawing Sheets

SYSTEM AND METHOD FOR COMPENSATING FOR POWER LOSS DUE TO A RADIO FREQUENCY (RF) SIGNAL PROBE MISMATCH IN CONDUCTIVE SIGNAL TESTING

BACKGROUND

The present invention relates to compensating for power loss of a radio frequency (RF) signal probe mismatch in conductive signal testing of a RF data signal transceiver, and in particular, to compensating for such power loss during conductive signal testing.

Many of today's electronic devices use wireless signal technologies for both connectivity and communications purposes. Because wireless devices transmit and receive electromagnetic energy, and because two or more wireless devices have the potential of interfering with the operations of one another by virtue of their signal frequencies and power spectral densities, these devices and their wireless signal technologies must adhere to various wireless signal technology standard specifications.

When designing such wireless devices, engineers take extra care to ensure that such devices will meet or exceed each of their included wireless signal technology prescribed standard-based specifications. Furthermore, when these devices are later being manufactured in quantity, they are tested to ensure that manufacturing defects will not cause improper operation, including their adherence to the included wireless signal technology standard-based specifications.

Testing of such wireless devices typically involves testing of the receiving and transmitting subsystems of the device under test (DUT). The testing system will send a prescribed sequence of test data packet signals to a DUT, e.g., using different frequencies, power levels, and/or signal modulation techniques to determine if the DUT receiving subsystem is operating properly. Similarly, the DUT will send test data packet signals at a variety of frequencies, power levels, and/or modulation techniques for reception and processing by the testing system to determine if the DUT transmitting subsystem is operating properly.

For testing these devices following their manufacture and assembly, current wireless device test systems typically employ testing systems having various subsystems for providing test signals to each device under test (DUT) and analyzing signals received from each DUT. Some systems (often referred to as "testers") include, at least, one or more sources of test signals (e.g., in the form of a vector signal generator, or "VSG") for providing the source signals to be transmitted to the DUT, and one or more receivers (e.g., in the form of a vector signal analyzer, or "VSA") for analyzing signals produced by the DUT. The production of test signals by the VSG and signal analysis performed by the VSA are generally programmable (e.g., through use of an internal programmable controller or an external programmable controller such as a personal computer) so as to allow each to be used for testing a variety of devices for adherence to a variety of wireless signal technology standards with differing frequency ranges, bandwidths and signal modulation characteristics.

The testing environment may include one or both of two general forms of RF signal conveyance: (1) conductive, or wired, and/or (2) radiative, or wireless. In the case of the former (typically implemented as a co-axial cable with a signal conductor surrounded by a grounded conductor acting as a shield against external electromagnetic interference), one important characteristic is that of signal path loss through the conductive signal path. Another is that of signal reflections and power loss due to mismatches caused by the RF signal probe that connects to the DUT between the impedances of the conductive signal path and conductive signal connector of the DUT. While the actual techniques used to determine signal path loss and/or probe mismatches are simple, they have required interruption and re-configuration of the RF signal connections as part of the test operations, e.g., prior to and/or during each test sequence. This results in longer test times and increased testing costs due to such time delays as well as potential repairs or rework of signal connections.

SUMMARY

System and method for compensating for power loss due to a radio frequency (RF) signal probe mismatch in conductive RF signal testing of a RF data signal transceiver device under test (DUT). Sourcing the RF test signal with the RF vector signal transceiver at multiple test frequencies enables isolation of and compensation for power loss due to a mismatch between the RF signal probe and RF DUT connection based on predetermined losses of the RF signal path.

In accordance with example embodiments, a system for compensating power loss of a radio frequency (RF) signal probe used in conductive RF signal testing of a device under test (DUT) includes: a RF vector signal transceiver responsive to one or more transceiver control signals by generating one or more outgoing RF signals and time domain processing one or more incoming RF signals; a RF signal probe to convey the one or more outgoing RF signals and the one or more incoming RF signals to and from, respectively, a DUT; a conductive RF signal path connected to and between the RF vector signal transceiver and the RF signal probe via first and second signal path ends, respectively, to convey the one or more outgoing RF signals and the one or more incoming RF signals; one or more processors coupled to communicate with the RF vector signal transceiver; and one or memory devices coupled to the one or more processors and comprising a non-transitory computer readable medium containing a plurality of computer readable instructions. When executed by the one or more processors, the computer readable instructions cause the one or more processors to provide the one or more transceiver control signals such that: the one or more outgoing RF signals comprise an iterative plurality of mutually distinct RF signal frequencies with a single frequency tone; the one or more incoming RF signals comprise a plurality of reflected RF signals from the RF signal probe and related to at least a portion of the one or more outgoing RF signals; and the time domain processing one or more incoming RF signals includes computing a plurality of measured signal magnitudes of the plurality of reflected RF signals, and computing a plurality of net signal magnitudes of the plurality of reflected RF signals reduced by corresponding ones of a plurality of predetermined path losses of the conductive RF signal path corresponding to the plurality of mutually distinct RF signal frequencies.

In accordance with further example embodiments, a method for compensating power loss of a radio frequency (RF) signal probe used in conductive RF signal testing of a device under test (DUT) includes: responding, with a RF vector signal transceiver, to one or more transceiver control signals by generating one or more outgoing RF signals and time domain processing one or more incoming RF signals; conveying the one or more outgoing RF signals and the one or more incoming RF signals via a RF signal probe to and from, respectively, a DUT; conveying the one or more outgoing RF signals and the one or more incoming RF signals via a conductive RF signal path that is connected to and between the RF vector signal transceiver and the RF signal probe via first and second signal path ends, respectively; and communicating with the RF vector signal transceiver by accessing and executing a plurality of computer readable instructions. Execution of the computer readable instructions cause the one or more transceiver control signals to be provided such that: the one or more outgoing RF signals comprise an iterative plurality of mutually distinct RF signal frequencies with a single frequency tone; the one or more incoming RF signals comprise a plurality of reflected RF signals from the RF signal probe and related to at least a portion of the one or more outgoing RF signals; and the time domain processing one or more incoming RF signals includes computing a plurality of measured signal magnitudes of the plurality of reflected RF signals, and computing a plurality of net signal magnitudes of the plurality of reflected RF signals reduced by corresponding ones of a plurality of predetermined path losses of the conductive RF signal path corresponding to the plurality of mutually distinct RF signal frequencies.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the figures illustrate diagrams of the functional blocks of various embodiments, the functional blocks are not necessarily indicative of the division between hardware circuitry.

Figure 1:
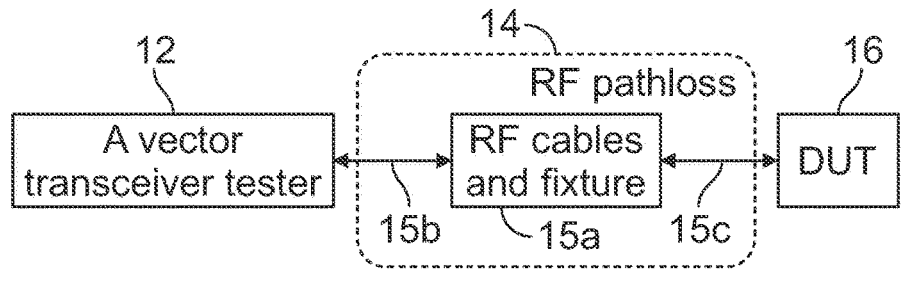
FIG. 1 depicts a common test environment for conductive RF signal testing.

Referring to FIG. 1, a common test environment 10a for conductive RF signal testing includes a tester 12 (e.g., a VSG and VSA combination, or a vector transceiver), and a conductive RF test signal path 14 to connect to the DUT 16. The signal path 14 may include one or more RF cables and fixture(s) 15a connected to the tester 12 via a RF connector 15b and to the DUT 16 via another RF connector 15c. In order to test the DUT 16 accurately RF signal loss of the signal path 14 must be determined to enable accurate measurements of signals received by and from the DUT 16. Three techniques for doing this currently predominate.

One method includes use of a RF signal source (e.g., the tester 12) connected via the RF signal path 14 to a power meter (not shown), in place of the DUT 16, to measure an absolute power difference between what the power meter receives and the known signal power from the source. However, this requires a high accuracy of the measured difference between the source and power meter, as well as reconfiguring the DUT testing arrangement to connect the signal source and power meter via the signal path 14.

A second method includes use of a two-port vector network analyzer (VNA, not shown) in place of the tester 12 with two ports at each connection 15b, 15c to the RF signal path 14 to measure insertion loss (often referred to as S21 in S-parameters terms) more directly. So, this requires more expensive test equipment, e.g., a VNA, as well as also reconfiguring the DUT testing arrangement to connect to the VNA.

A third method includes use of the tester 12 at one connection 15b to the RF signal path 14 and uses of an open circuit connection (OPEN), a shorted circuit connection (SHORT), and a load connection (LOAD) having the appropriate characteristic impedance of the RF system being tested (e.g., 50 ohms resistive) each time at the other connection 15c to enable measurements of return loss for each terminal connection (OPEN, SHORT and LOAD). All three measured results may then be used to calculate the path loss. This has the effect of effectively using the normal DUT testing arrangement_as an emulated vector network analyzer (VNA) to measure return loss (S-parameter S11). Modern VSA/VSG systems may also perform such a measurement if they support simultaneous VSG/VSA operation and perform appropriate processing of the transmitted and received signals. While this method may enable maintaining the DUT testing arrangement, it still requires designing special connectors for the OPEN, SHORT and LOAD measurements as well as three operations to switch among these three special connectors. (This is often referred to as the OSL method.)

The disadvantages of these methods may be avoided using systems and methods of currently disclosed example embodiments. As discussed in more detail below, a vector transceiver (e.g., a tester 12) connects to the input 15b of the RF signal path 14 and an OPEN connects at the output 15c. Advantages include maintaining the DUT testing arrangement and avoiding need for additional or different test equipment, thereby saving operation time and cost. Further, while a special OPEN connector may be helpful, it should not be necessary since one may instead simply the output connection 15c of the RF signal path 14 unterminated and thereby serving as an OPEN. In most automated testing arrangements a RF signal probe may be used at the end of the cable which may serve as an OPEN connection when unterminated e.g., not connected to a load such as a DUT.

Figure 2:
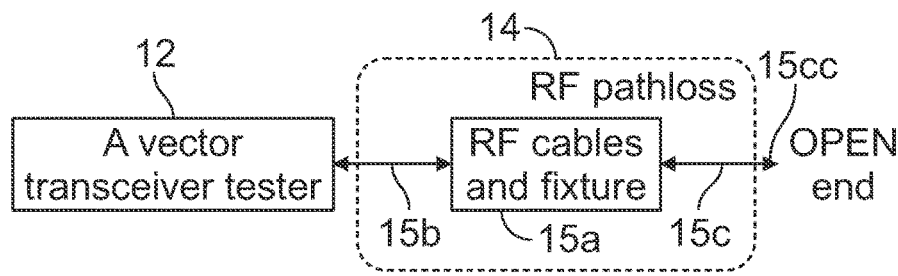
FIG. 2 depicts a test environment for conductive RF signal testing in accordance with example embodiments.

Referring to FIG. 2, a test environment 10b for conductive RF signal testing in accordance with example embodiments includes the tester 12 (e.g., vector signal transceiver), and the conductive RF test signal path 14 that includes one or more RF cables and fixture(s) 15a connected to the tester 12 via an input RF connector 15b and an output RF connector 15c. However, when testing for path losses, the output RF connector 15c may remain unterminated to provide an OPEN connection 15cc.

As an optional initial procedure one may establish or otherwise determine information about the testing hardware configuration(s) being used. For example, such information may include details about the RF signal path 14, such as the number of interconnected cables, length of each cable, how many connectors are in place, etc. As noted, instead of connecting the output connector 15c to the DUT 16, either a RF OPEN connector is connected or the output connector 15c is left unconnected (i.e., unterminated)

A range of RF test signal frequencies to be measured (e.g., with corresponding frequency margins) may be selected or defined based on intended or anticipated DUT operations. The vector signal transceiver tester may be programmed or otherwise controlled to provide (e.g., generate and emit), with its transmitter, a single DC tone at the baseband frequency for each of the RF test signal frequencies, and enable its receiver to capture a corresponding return signal for each of the RF test signal frequencies. Captured I/Q signal samples may be averaged over time capture to compute a single complex number. Iterating these steps of transmitting incident signals and capturing reflected signals over portions or all of the defined range of frequencies may enable computation of an array of complex numbers, each of which corresponds to a respective one of the defined frequencies. Such complex numerical array may be processed in accordance with known principles to calculate a path loss for each frequency to be measured.

Figure 3:
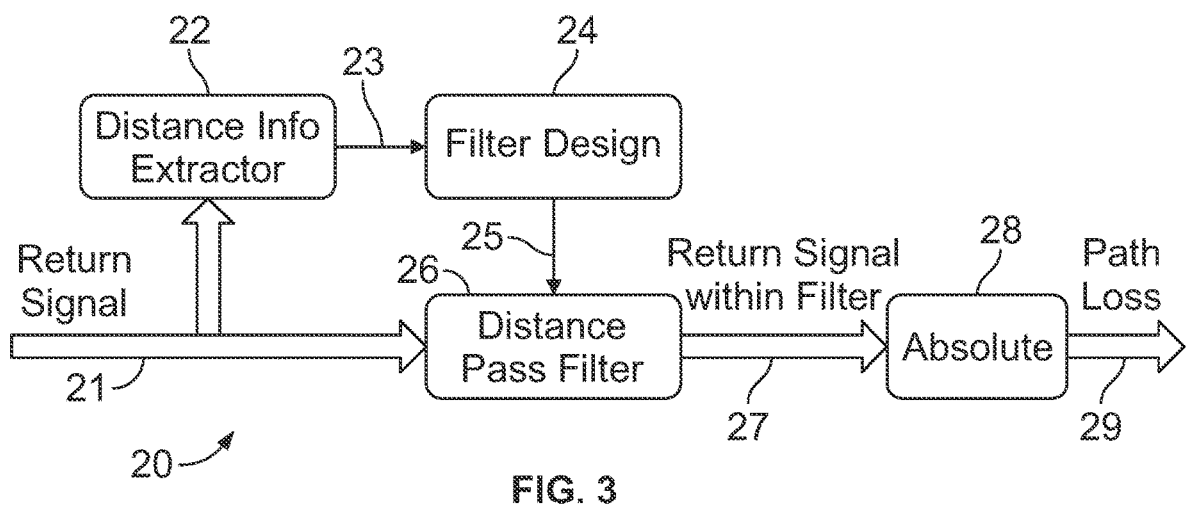
FIG. 3 depicts design and use of signal data filters in accordance with example embodiments.

Referring to FIG. 3, this processing 20 may include steps by which the return signal data 21 may be processed 22 to extract time or distance information 23 (discussed in more detail below) for use in designing a filter 24, the characteristics 25 of which may be used to filter 26 the return signal data 21. The filtered return signal data 27 may be averaged to compute 28 absolute path loss 29 for the frequency being tested. Such processing 20 may be structured or applied from the perspective of either a distance domain or frequency domain to effectively serve the same purpose, e.g., by processing, filtering and averaging measured signal data that is processed along the way as corresponding to distances (e.g., traversed by the incident and/or reflected signal pulses) or frequencies (e.g., of the incident and/or reflected signals).

Figure 4:
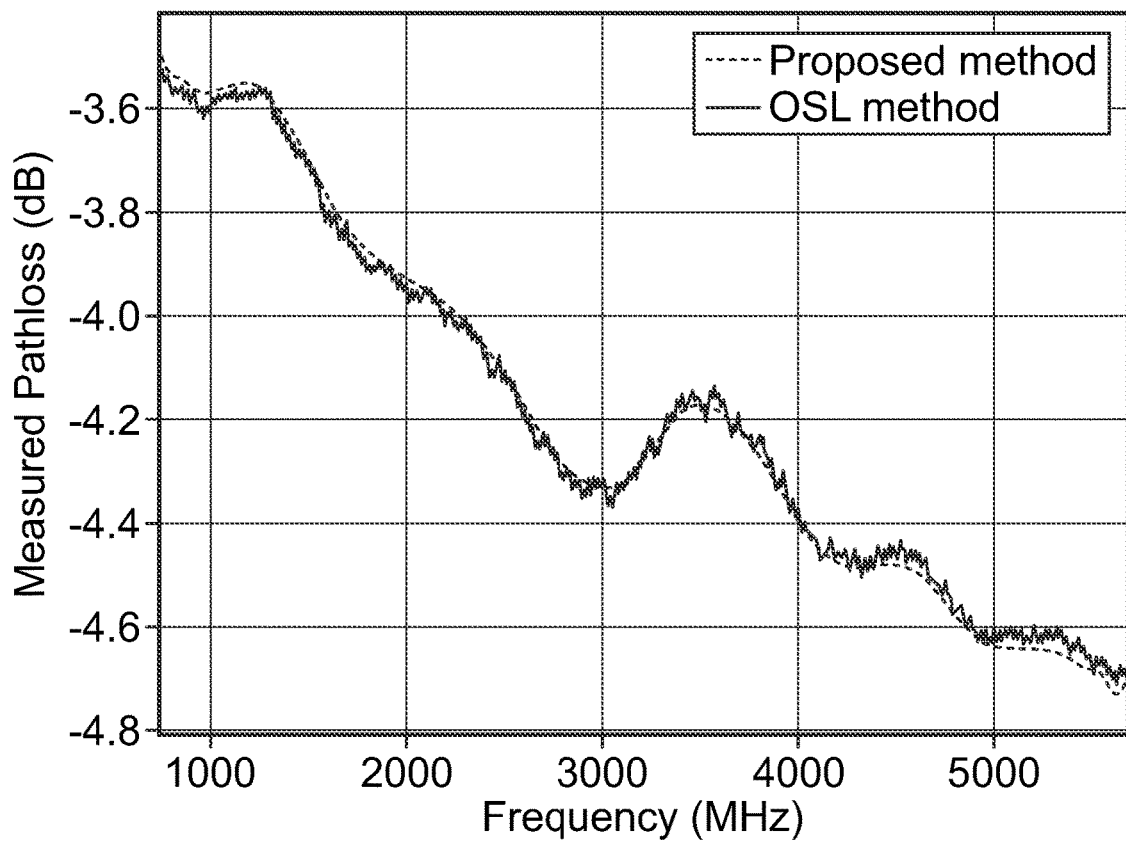
FIG. 4 depicts a comparison of empirical test data using a conventional OSL technique and a technique in accordance with example embodiments.

Referring to FIG. 4, a linear graph of empirical test results of measured path losses over a frequency range from below 1 GHz to more than 5 GHz using a conventional OSL method and a method in accordance with example embodiments as discussed above demonstrates how closely the more advantageous techniques discussed herein produce test results closely tracking those of conventional OSL techniques.

As noted above, conventional path loss measurement and compensation techniques fail to account much less compensate for additional signal loss(s) at the RF probe that connects to the DUT, thereby effectively assuming that perfect matching exists between the RF probe and the RF connector on the DUT. However, since successfully connecting the RF probe to the DUT primarily relies upon a mechanical operation and is controlled by application of appropriate physical forces. Hence, soon after multiple connections have been made and removed, associated changes in surface abrasions and application forces, cause degradations in the matching between the RF probe to the DUT connector. This results in further power losses in the signal path that will not be detected or compensated by path loss measurements alone as discussed above. Such additional power losses caused by such RF probe connector mismatches may result in a higher rate of re-testing DUTs, which, in turn, requires additional instances of DUT connections and may lead to reduced manufacturing yield rates.

Figure 5:
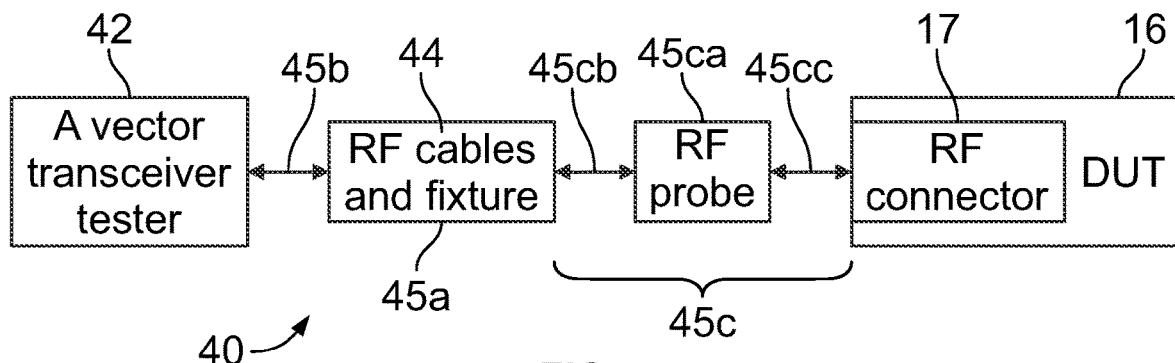
FIG. 5 depicts a test environment for conductive RF signal testing in accordance with example embodiments.

Referring to FIG. 5, a test environment 40 for detecting and enabling compensation for RF probe mismatched when performing conductive RF signal testing in accordance with example embodiments includes a tester 42 (e.g., VSG/VSA combination or vector signal transceiver), and a conductive RF test signal path 44 to enable connection to the DUT 16. The signal path 44 may include one or more RF cables and fixture(s) 45a connected to the tester 42 via a RF connector 45b and to the DUT 16 via a RF probe assembly 45c. Connection to the DUT 16 is completed via an input RF probe connector 45cb, the RF probe 45ca and an output RF probe connector 45cc that, in turn, connects to a RF connector 17 of the DUT 16.

As discussed in more detail below, in accordance with example embodiments, compensation may be provided for power loss of RF probe mismatches in conductive RF signal testing by measuring the return signal to estimate the reflection signal caused by the RF probe mismatches and, in turn, account for such reflection as an additional signal path power loss. Advantages include maintaining the DUT testing configuration since any additional power loss may be measured with the DUT remaining in its desired testing configuration. Full control may be retained by the tester since DUT control action is unnecessary. Compensation for such additional power loss may be provided following each DUT insertion into the testing configuration, thereby increasing accuracy of the DUT RF test.

This process may be performed by first connecting the DUT to the RF probe. This may be preceded by, followed by or performed concurrently with defining specific frequencies at which measurements are to be performed. The vector transceiver tester may transmits a single DC tone at the baseband signal frequency while any resulting reflections of such incident signal transmissions may be captured by the receiver of the tester. An average over time of the captured I/Q samples may be computed to provide a single complex number. Such incident signal transmissions, reflected signal captures and average computations may be iterated over the defined range of frequencies. Finally, the computed complex numbers may be processed to determine the reflection signal caused by RF probe mismatches.

This processing of the computed complex numbers to determine the reflection signal caused by RF probe mismatches may be performed in conjunction with RF signal path loss data determined previously with the conventional OSL method discussed above. This will allow removal of RF signal path effects of the original test configuration, with any remaining loss(s) to be attributed to reflection signals caused by RF probe mismatches and compensated. Alternatively, such processing may be performed in conjunction with RF signal path loss data determined by using the technique discussed above in which an OPEN (e.g., unterminated) RF signal path end connection is used with a vector transceiver tester to extract the reflection signals from the RF probe caused by matching issues. If the reflection signal exceeds or otherwise transverses a predetermined threshold, testing may be aborted to enable such issues to rectified or otherwise resolved. Otherwise, compensation for the added power loss may be applied by the tester while DUT RF testing continues.

Figure 6:
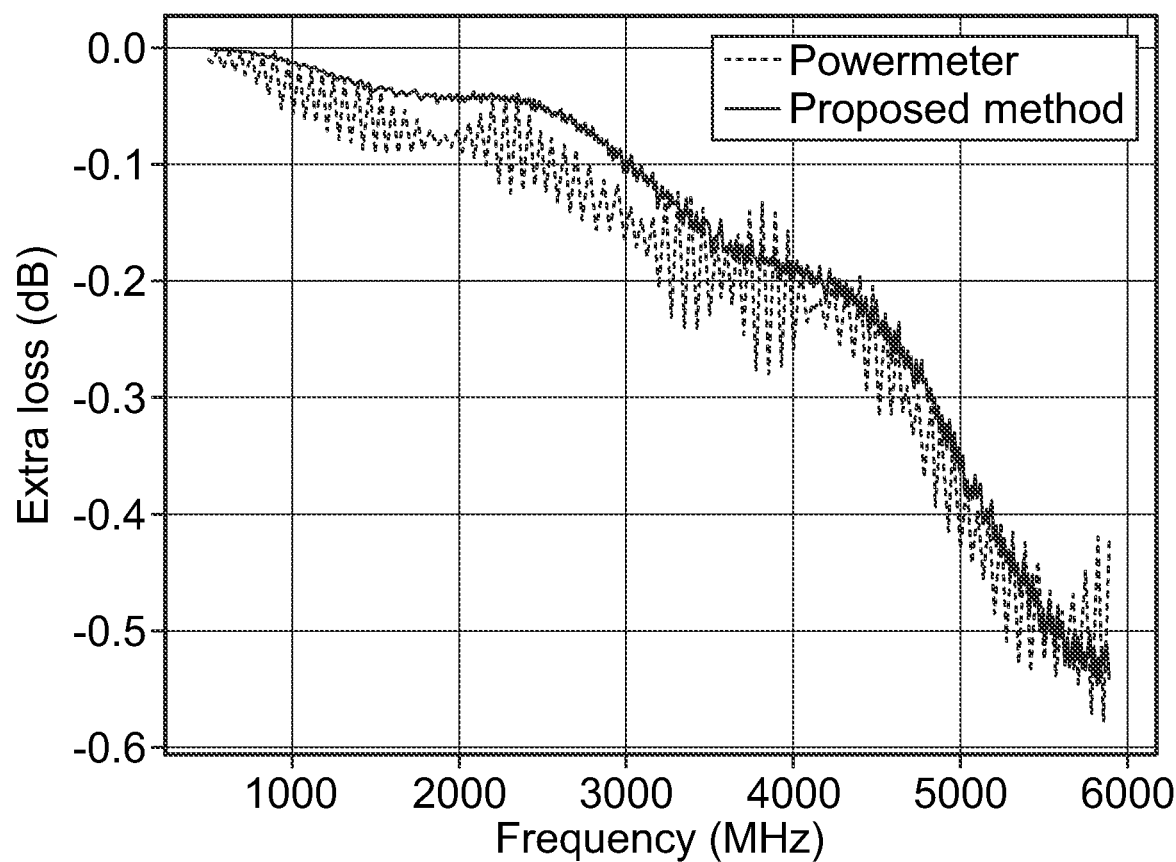
FIG. 6 depicts a comparison of empirical test data using a conventional RF power meter and an SMA co-axial connector as the RF probe in accordance with example embodiments.

Referring to FIG. 6, a linear graph of empirical test results of measured path losses due to RF probe reflections over a frequency range from below 1 GHz to nearly 6 GHz using a conventional power meter method and a method in accordance with example embodiments as discussed above demonstrates how closely the more advantageous techniques discussed herein produce test results closely tracking those of conventional power meter techniques.

Figure 7:
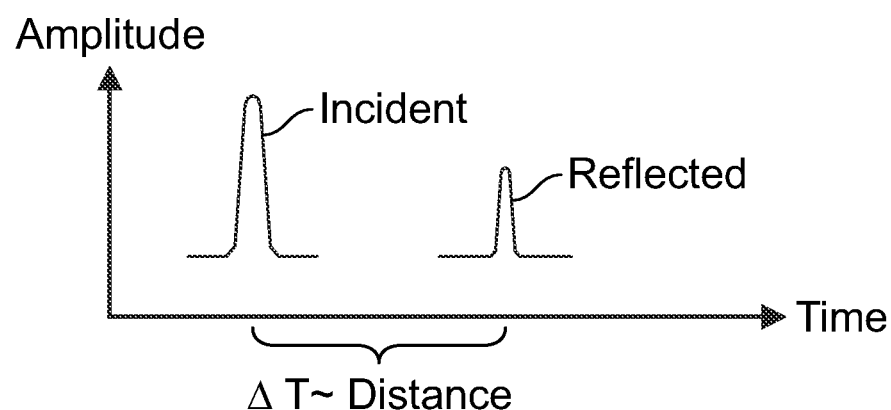
FIG. 7 depicts a time relationship between corresponding incident and reflected RF signals.

Referring to FIG. 7, as noted above, these operations may be performed from the perspective of time or distance domains. As depicted here, as will be readily appreciated by one of ordinary skill in the art, interrelatedness of processing in the time and distance domains may be more readily understood in view of the fact that the reflected signal pulse will be captured by the receiver of the tester after a time delay ΔT that is known to be related to the distance over which the reflected signal pulse must travel following transmission of the incident signal pulse.

Various other modifications and alternatives in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a system for compensating power loss of a radio frequency (RF) signal probe used in conductive RF signal testing of a device under test (DUT), comprising:
   a RF vector signal transceiver responsive to one or more transceiver control signals by generating one or more outgoing RF signals and time domain processing one or more incoming RF signals;
   a RF signal probe to convey said one or more outgoing RF signals and said one or more incoming RF signals to and from, respectively, a DUT;
      a conductive RF signal path connected to and between said RF vector signal transceiver and said RF signal probe via first and second signal path ends, respectively, to convey said one or more outgoing RF signals and said one or more incoming RF signals;
      one or more processors coupled to communicate with said RF vector signal transceiver; and
      one or memory devices coupled to said one or more processors and comprising a non-transitory computer readable medium containing a plurality of computer readable instructions that, when executed by said one or more processors, cause said one or more processors to provide said one or more transceiver control signals such that
      said one or more outgoing RF signals comprise an iterative plurality of mutually distinct RF signal frequencies with a single frequency tone,
      said one or more incoming RF signals comprise a plurality of reflected RF signals from said RF signal probe and related to at least a portion of said one or more outgoing RF signals, and
      said time domain processing one or more incoming RF signals comprises
         computing a plurality of measured signal magnitudes of said plurality of reflected RF signals, and
         computing a plurality of net signal magnitudes of said plurality of reflected RF signals reduced by corresponding ones of a plurality of predetermined path losses of said conductive RF signal path corresponding to said plurality of mutually distinct RF signal frequencies.

2. A method for compensating power loss of a radio frequency (RF) signal probe used in conductive RF signal testing of a device under test (DUT), comprising:
   responding, with a RF vector signal transceiver, to one or more transceiver control signals by generating one or more outgoing RF signals and time domain processing one or more incoming RF signals;
   conveying said one or more outgoing RF signals and said one or more incoming RF signals via a RF signal probe to and from, respectively, a DUT;
   conveying said one or more outgoing RF signals and said one or more incoming RF signals via a conductive RF signal path that is connected to and between said RF vector signal transceiver and said RF signal probe via first and second signal path ends, respectively; and
   communicating with said RF vector signal transceiver by accessing and executing a plurality of computer readable instructions to provide said one or more transceiver control signals such that
      said one or more outgoing RF signals comprise an iterative plurality of mutually distinct RF signal frequencies with a single frequency tone,
      said one or more incoming RF signals comprise a plurality of reflected RF signals from said RF signal probe and related to at least a portion of said one or more outgoing RF signals, and
      said time domain processing one or more incoming RF signals comprises
         computing a plurality of measured signal magnitudes of said plurality of reflected RF signals, and
         computing a plurality of net signal magnitudes of said plurality of reflected RF signals reduced by corresponding ones of a plurality of predetermined path losses of said conductive RF signal path corresponding to said plurality of mutually distinct RF signal frequencies.

* * * * *